United States Patent [19]

Hack et al.

[11] Patent Number: 4,996,573

[45] Date of Patent: Feb. 26, 1991

[54] VERTICAL THIN FILM TRANSISTOR AND OPTICAL SENSOR HAVING LEAKAGE CURRENT SUPPRESSION ELEMENTS

[75] Inventors: Michael Hack, Mountain View; John G. Shaw, Portola Valley, both of Calif.; Michael Shur, Charlottesville, Va.

[73] Assignee: Xerox Corporation, Stamford, Conn.

[21] Appl. No.: 428,814

[22] Filed: Oct. 27, 1989

[51] Int. Cl.$^5$ .................... H01L 27/01; H01L 27/12; H01L 29/48; H01L 29/10
[52] U.S. Cl. ................................... 357/23.700; 357/4; 357/15; 357/23.400; 357/30; 357/53
[58] Field of Search ...................... 357/23.7, 32, 30 K, 357/4, 15, 22 E, 22 B, 23.4, 30 I, 30 H, 30 S, 53

[56] References Cited

U.S. PATENT DOCUMENTS

| 4,746,960 | 5/1988 | Valeri et al. | 357/23.7 |
| 4,755,859 | 7/1988 | Suda et al. | 357/23.4 |
| 4,803,533 | 2/1989 | Chang et al. | 357/23.4 |

Primary Examiner—William Mintel
Assistant Examiner—Roy Potter
Attorney, Agent, or Firm—Serge Abend

[57] ABSTRACT

A thin film transistor and optical sensor including a substrate upon which are supported a gate electrode layer, a gate dielectric layer, a source electrode comprising finger elements, a semiconductor layer overlying the gate dielectric layer and at least partially surrounding the source electrode, a drain electrode layer contiguous with the semiconductor layer, barrier elements for inhibiting a drain field from reaching the source electrode, and a transparent, electrically conductive drain contact member contiguous with said drain electrode layer, through which optical energy may pass to the semiconductor layer.

14 Claims, 5 Drawing Sheets

VERTICAL THIN FILM TRANSISTOR AND OPTICAL SENSOR HAVING LEAKAGE CURRENT SUPPRESSION ELEMENTS

FIELD OF THE INVENTION

This invention relates to a vertical thin film device having an extremely short current flow path formed without use of critical lithography which may be used interchangeably as either a high current, moderate voltage, transistor or as a high gain optical sensor having a good dynamic range. OFF state leakage current, for both the thin film transistor and optical sensor, is inhibited by barrier elements located between source and drain electrodes.

BACKGROUND OF THE INVENTION

Because of their relative ease of fabrication on large area substrates thin film transistors (TFTs) have been actively studied for use in driving individual pixels in large area displays, such as liquid crystal displays. The TFTs generally comprise laterally spaced apart source and drain electrodes, held at different potentials, and electrically interconnected by a semiconductor material which forms a channel therebetween. Current flow between these electrodes, is controlled by the application of a voltage to a gate electrode, which is adjacent a portion of the semiconductor channel and is insulated therefrom. The gate field acts to invert or accumulate a portion of the semiconductor material, thereby conductively coupling the source and drain electrodes.

Amorphous silicon technology was initially developed primarily for photovoltaics but recently the microelectronic applications therefor have become more and more important. This material is ideally suited for use in large area arrays because of the low deposition temperatures involved in its fabrication and the availability of large area deposition and lithographic equipment. A shortcoming of amorphous silicon is its relatively low electron mobility which limits the operating speed of these transistors. The operating speed may be improved and the output current may be increased by reducing the channel length L, because the transit time of electrons across the channel is proportional to $L^2$ and the output current is inversely proportional to the channel length (1/L). Typically, lithographically produced amorphous silicon TFTs have channel lengths of about 10 $\mu$m. Of course, the channel length could possibly be decreased substantially by using critical lithographic techniques developed for VLSI fabrication, but this solution is very costly and is impractical over the large areas contemplated (e.g. one foot square and larger). In fact, it is likely that a one micron feature size cannot be accurately maintained over very large areas.

Another consideration to be borne in mind with respect to amorphous silicon devices is that these TFTs operate with a field effect mobility of around 1 $cm^2$/volt-sec despite the fact that the amorphous silicon electron band mobility is 10 to 20 $cm^2$/volt-sec. This is due to traps in the material, in the form of localized tail states, which allow only a small fraction (about 10 to 20%) of the charge induced into the channel of these TFTs to become mobile carriers. For a 10 $\mu$m feature size and gate width-to-length ratio of 10, one may expect output currents on the order of 10 to 50 $\mu$amp and a transit time of approximately 100 nsec for drive voltages ($V_{DS}$) in the range of 10 to 20 volts. In practice, switching speeds also will be reduced by circuit capacitances. Improved current drive capabilities necessitate shorter channel lengths. Although amorphous silicon has been the most promising semiconductor material for TFTs, silicon in its polycrystalline or microcrystalline states may be fabricated over large areas and yield attractive results, and other semiconductor materials, such as Ge, GaAs and CdS, in these three states also have been found to be satisfactory.

A vertical, short channel thin film transistor, whose effective channel length is much less than any minimum lithographic feature size used in its fabrication, is disclosed in a copending application assigned to the same assignee as the instant invention. The copending application, entitled "High Current Thin Film Transistor" (Hack et al), filed on Mar. 29, 1988 and bearing Ser. No. 07/174,652 is fully incorporated herein by reference.

Thin film amorphous silicon sensors and phototransistors are well known. In large area applications, where transistors and sensors are fabricated upon the same substrate, such as, for example, in an optical scanning array, it would be convenient to configure these devices so as to have compatible fabrication techniques.

Therefore, it is an object of the present invention to provide a single vertical thin film structure which will operate as either a short channel, high current, thin film transistor or a high gain optical sensor in which barrier elements for improve the ON/OFF current ratio of both the transistor and sensor devices.

It is another object of this invention to provide a source electrode structure which introduces a lateral electric field in order to increase the transient response time of the sensor.

SUMMARY OF THE INVENTION

The present invention may be carried out, in one form, by providing a vertical thin film transistor and sensor comprising a substrate upon which are supported a gate electrode layer, a gate dielectric layer, a source electrode comprising several fingers, a semiconductor layer overlying the gate dielectric layer and at least partially surrounding the source electrode, and a drain electrode layer contiguous to the semiconductor layer. Barrier elements are positioned between the source electrode and the semiconductor layer for inhibiting the drain field from reaching the source electrode, and a transparent, electrically conductive drain contact layer overlying the drain electrode layer for allowing optical energy to pass to the semiconductor layer.

BRIEF DESCRIPTION OF THE DRAWINGS

Other objects and further features and advantages of this invention will be apparent from the following, more particular, description considered together with the accompanying drawings, wherein.

DESCRIPTION OF THE ILLUSTRATED EMBODIMENTS

Figure 1:
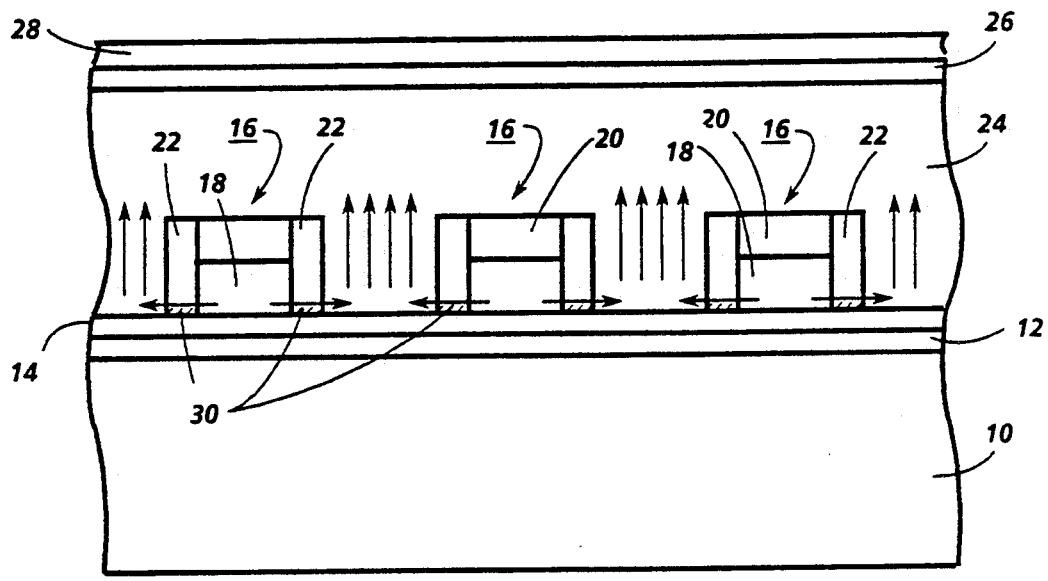
FIG. 1 is a side sectional view of a vertical thin film transistor/sensor having sidewall barrier elements according to the present invention.

Turning now to FIG. 1 there is illustrated a vertical, bottom gate, short channel, thin film transistor/sensor. By vertical we mean that the primary path of the majority charge carrier movement is through the thickness of the semiconductor layer in the direction parallel to the direction of the gate field, as opposed to movement within a narrow channel of the semiconductor layer extending in the direction perpendicular to the gate field. We have found this vertical orientation to be desirable because the current path between source and drain electrodes is established primarily by the deposited thickness of a semiconductor layer and not by lithography, and as this is short, it enables more current to flow. Since it is well known that the art of thin film layer deposition allows accurate conformal formation of layers on the order of tens of Angstroms, this transistor configuration allows one to obtain the performance of 1 micron, and shorter, channel lengths while using 5 to 10 μm lithography or larger. Furthermore, this design separates the gate and drain electrodes by the channel length, thereby preventing breakdown between these electrodes.

Figure 2:
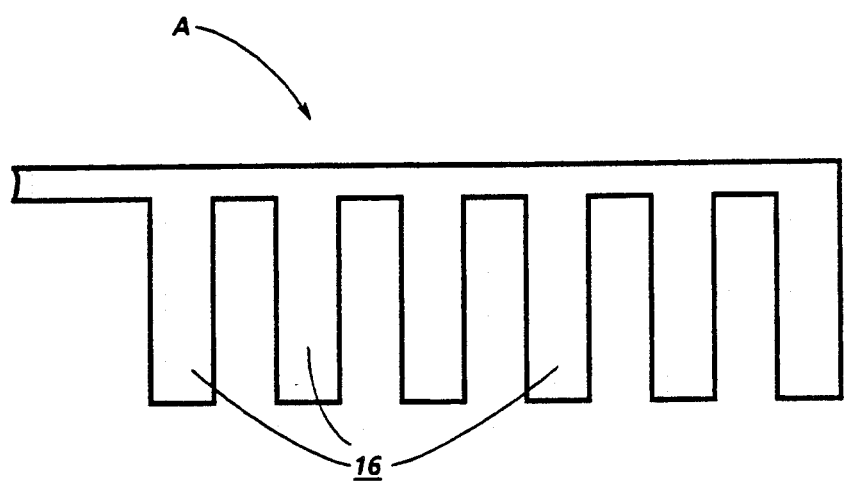
FIG. 2 is a plan view of a source electrode array for use in the transistor/sensor of FIG. 1.

Upon a suitable substrate 10, such as glass, there is deposited a conducting gate electrode layer 12 (about 500 to 1000 Å thick), preferably metallic, such as chromium, over which lies a gate dielectric layer 14 (about 100 to 5000 Å thick), such as silicon nitride, silicon oxide or other thin film insulating material. Source electrode fingers 16 overlie the gate dielectric layer 14. Each finger comprises an n+ doped semiconductor stripe 18 (about 100 to 500 Å thick), adjacent layer 14, an overlying source metal strip 20 (about 1000 to 10,000 Å thick), such as a titanium/tungsten alloy, and barrier elements 22, in the form of lightly p−doped (p−) semiconductor sidewall members (about 1000 to 5000 Å wide). Typically, the fingers would be about 3 to 5 μm wide on 3 to 5 μm centers, thus posing no problem for standard lithographic patterning. The source finger array A is patterned, as illustrated in FIG. 2, so that the semiconductor stripes 18 and metal stripes 20 are in electrically parallel configuration. A semiconductor charge transport layer 24 (about 2000 to 40,000 Å thick), such as intrinsic or lightly doped amorphous silicon, surrounds the source electrode fingers 16 on three sides. A drain electrode layer 26, made of an n+ doped semiconductor (about 1000 to 20,000 Å thick) in turn overlies the charge transport layer 24, and a transparent, conductive, drain metal layer 28, such as ITO (about 500 to 2000 Å thick), or a thin semitransparent metal layer, such as evaporated chromium (about 50 to 100 Å thick) overlies the drain electrode layer. Alternatively, the drain metal layer such as would be used in a transistor (e.g. aluminum or chrome/aluminum about 1000 to 10,000 Å thick) could be patterned with fine perforations therethrough (e.g. a grid or stripes) between the source fingers for allowing light to pass to the semiconductor charge transport layer. Dimensions set forth are representative of typical ranges which we contemplate or have used in our experimentation and/or modeling, but are not intended to limit the size of these elements in future devices.

In operation of the FIG. 1 device as a transistor, the source and drain electrodes would have a drive potential maintained therebetween. For example, the source electrode fingers 16 may be at 0 volts and the drain electrode may be at about 10 volts. The gate potential would be switched from a low, OFF state, potential of, for example, −5 to 0 volts, to a high, ON state, potential of, for example, 0 to 10 volts. In the OFF state, the p− sidewalls 22 prevent current leakage by providing effective barriers to the movement of charge carriers from the source electrode semiconductor stripes 18 into the semiconductor charge transport layer 24. A Schottky barrier, between the metal stripes 20 and the semiconductor charge transport layer 24, prevents current flow directly between the metal stripes and the drain electrode 26.

When the gate electrode potential is switched to the ON state, channel portions 30 (indicated by hatched lines) through the sidewall barrier elements 22, lying adjacent to the gate dielectric 14, are inverted so that current may flow therethrough. Current flow follows the paths indicated by the arrows, namely, initially laterally from the n+ stripes 18 through the channel portions 30 of the sidewall barrier elements 22, and then vertically through the semiconductor charge transport layer 24 to the drain electrode 26. It should be noted that when the semiconductor charge transport layer is intrinsic, or lightly doped, amorphous silicon, vertical current flow through charge transport layer 24 is space charge limited. While this form of our device has an excellent ON/OFF ratio, the ON state current will be less than optimum because electrons moving through the p− doped semiconductor, in the channel portions 30, have a lower mobility than in undoped material.

Figure 3:
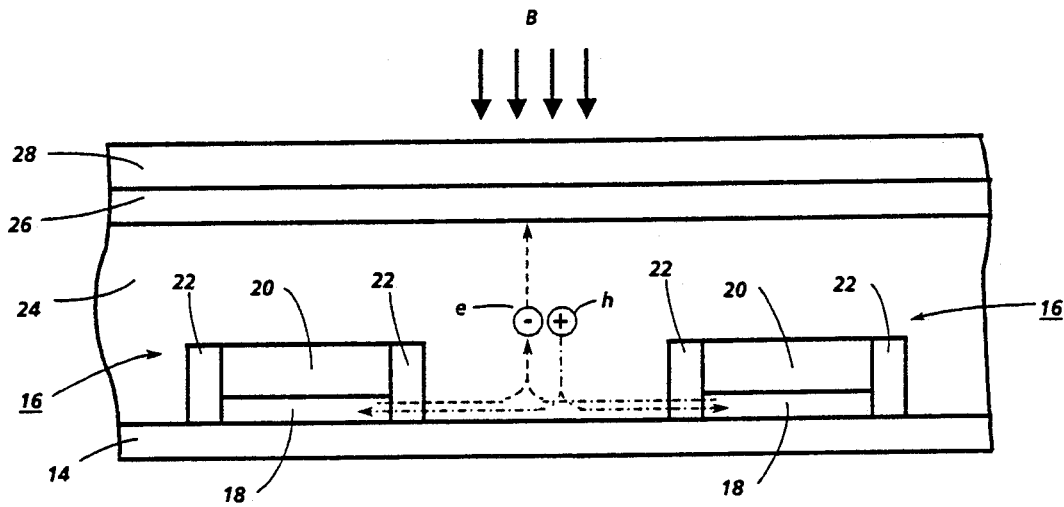
FIG. 3 is a side sectional view similar to FIG. 1 showing the movement of photogenerated electron/hole pairs.

In operation of the FIG. 1 device as a sensor, both the source and drain electrodes would have applied thereto a drive potential similar to that applied to the transistor, described above. The gate electrode, however, would have a fixed potential applied thereto which would be comparable to the low, OFF state, potential of the transistor, e.g. about −5 volts to 0 volts. In the dark (OFF), current flow is suppressed by the p-type barrier side walls 22 as in the transistor OFF state. When illuminated (ON), as shown in FIG. 3, electron-hole (e and h) pairs are generated within the semiconductor layer 24 by the optical energy radiated thereon (indicated by arrows B). The photogenerated electrons move to the drain electrode 26, while the photogenerated holes move through the p− sidewall barrier elements 22 to the n+ source electrodes 18 and are trapped therein. When holes move through the p− elements they create a low resistance path therein for electrons to move out of the source electrode. Since the electrons have a longer lifetime than their transit time through the internal drain-source-drain circuit, they will effectively continue to move around this internal circuit many times (as illustrated), giving rise to the high photoconductive gain of the sensor. For example, if each photogenerated electron moves, or causes another electron to move, through the internal circuit 10 times, the gain will be 10. As in the transistor form of this device, the ON state current flow will not be optimum because the electrons moving through the p− doped semiconductor, in the channel portions 30, have a lower mobility than in undoped material. However, it should be understood that this sensor device will have a gain and dynamic range sufficient for may applications.

The identical structure may be used for both transistor and sensor devices. By simply providing an opaque mask over those areas of an array containing these devices, the transistors and sensors will be defined. On the other hand, it should be well understood that during fabrication it is possible to deposit an opaque metal layer over the transistors and an ITO layer over the sensors.

Figure 4:
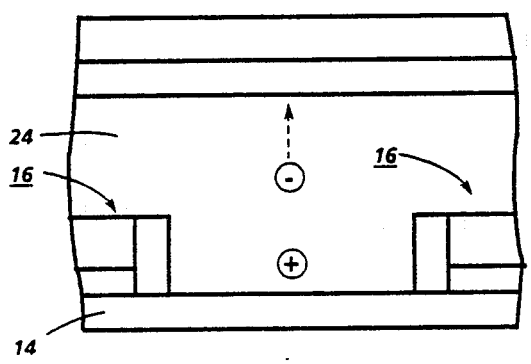
FIG. 4 is a side sectional view similar to FIG. 3 showing a trapped hole centrally located between two source electrode fingers.
Figure 5A:
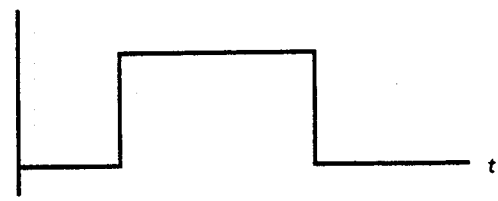
FIG. 5a is a graphical representation of light intensity during a single pulse of illumination.
Figure 5B:
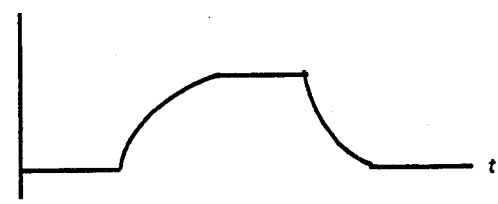
FIG. 5b is a graphical representation of current flow through the sensor in response to the single pulse of illumination.

In FIG. 4 there is shown an isolated photogenerated hole centrally positioned between two source electrode fingers 16. Because the source electrode fingers (constructed as shown in FIG. 2) are connected in parallel, all of them will be at the same potential and there will be no lateral electric field to drive the hole to either finger. A hole entering this central, low field region will slowly diffuse into a high field region before it is collected, resulting in a relatively slow transient response time as is illustrated by comparing FIGS. 5a, which shows an optical energy pulse, with FIG. 5b, which shows the photogenerated current response. Moreover, by remaining in the material for a sufficiently long time it is likely to be trapped and, as the release time can be quite long, this will further increase the response time. Current continues to flow after the optical energy pulse has terminated on the order of milliseconds, as indicated by the signal tail, caused by the moving holes. Although such a device may have utility in some applications, a transient response time on the order of microseconds would be more desirable.

Figure 6:
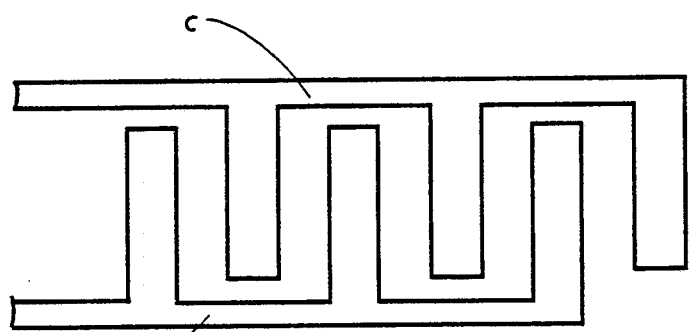
FIG. 6 is a plan view of a pair of interdigitated source electrode arrays.

We are able to substantially shorten the transient response time by providing a pair of interdigitated source electrode arrays as shown in FIG. 6. Array C will have a first potential applied to it and array D will have a second potential applied to it, the potential differential being sufficiently small so as not to adversely affect the operation of the device. For example, a potential differential on the order of 1 or 2 volts is believed to be satisfactory. The two source electrode arrays should be nearly at the same voltage but equal to or greater than the voltage on the gate electrode. By decreasing the lateral distance between the source electrode fingers, it is possible to further lower the potential differential. When used in the transistor mode, it would be possible to electrically tie the two arrays together so that they perform exactly as does the FIG. 2 source electrode array.

Figure 7:
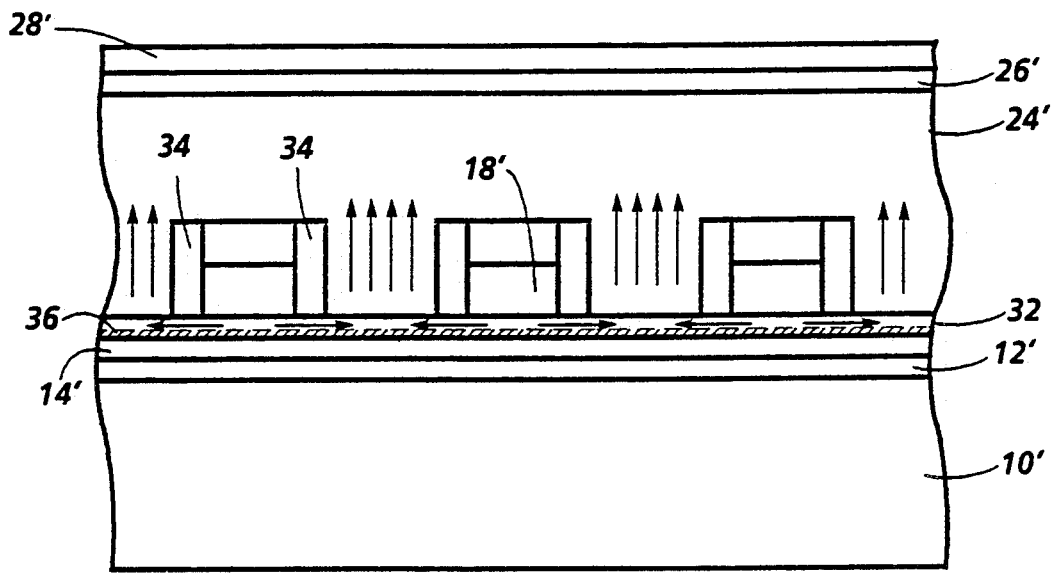
FIG. 7 is a side sectional view of a thin film transistor similar to that of FIG. 1 including proximity current barrier means.
Figure 8:
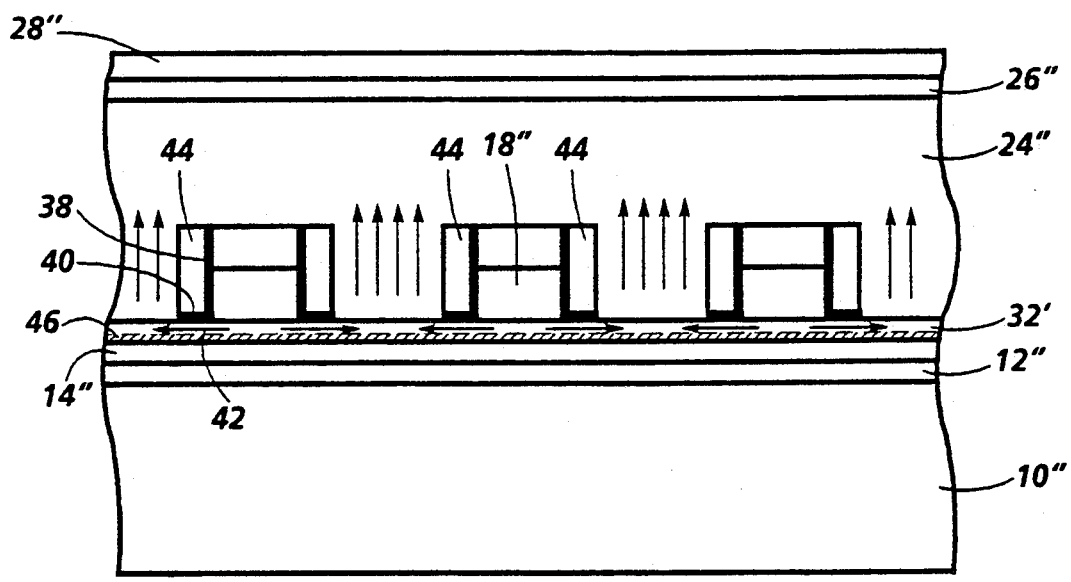
FIG. 8 is a side sectional view of a thin film transistor similar to that of FIG. 1 showing another form of proximity current barrier means.

In the FIG. 1 vertical device structure, described above, the p− doped sidewall barrier elements will reduce the ON current in both the transistor and sensor devices. Blocking configurations which do not significantly reduce the ON current are shown in FIGS. 7 and 8 in which similar elements have been identified by similar numerals with a prime (') added. The FIG. 7 device further includes a thin semiconductor layer 32 (about 100 to 2000 Å thick), such as intrinsic or lightly doped amorphous silicon, overlying the gate dielectric layer 14', and heavily p-doped (p+) sidewall barrier elements 34 are in contact with this layer. The drain field is prevented from reaching the n+ source electrodes 18' and drawing out charge carriers by the proximity blocking effect of the p+ barrier elements 34 which pinch off the leakage channel through the thin semiconductor layer 32 due to the spillover of holes into, or depletion of electrons from, the thin semiconductor layer. A p-type proximity barrier region, induced in this layer in the vicinity of the sidewall barrier elements, inhibits electron movement therethrough and suppresses OFF state current leakage in the device. Another factor in suppressing the OFF state leakage current is the field plate effect of the p+ barrier elements, maintained at the source electrode potential, which prevent the drain field from reaching the source electrode.

When this form of the transistor device is turned ON, by applying a positive potential to the gate electrode 12', an accumulation channel region 36 (shown by hatch lines) will be formed as the gate field overcomes hole spillover at the silicon/silicon nitride interface, allowing free movement of electrons therethrough. Similarly, when the sensor device is turned ON by subjecting it to illumination, the semiconductor layer 24' becomes conductive by generating electron/hole pairs. The photogenerated electrons move to the drain electrode 26', and the photogenerated holes move through the p-type proximity barrier region to the n+ source electrodes 18' and are trapped therein. As holes move through the proximity barrier region they create a low resistance path therein for electrons to move out of the source electrode and through the internal circuit.

In FIG. 8 there is shown a shield plate or field plate embodiment of the present invention, in which the OFF state leakage current is inhibited without introducing defects into the thin semiconductor layer 32'. Each sidewall barrier element is in the form of a metal cladding layer (such as chromium) having a sidewall 38 and an outboard flange 40. The sidewall 38 blocks charge carrier movement through the sides of the n+ source electrode fingers 18" and the flange defines a blocking tunnel, or gauntlet, 32 in the thin semiconductor layer 32'. Masking members 44, which may be made of silicon nitride or p-type semiconductor, are positioned outboard of the metal cladding layer and serve only to aid in fabrication, by defining the flange length and, thereby, the length of tunnel 42.

The desired blocking effect is provided, in the OFF state, by the tunnel, or gauntlet region, in the thin semiconductor layer 32', lying between the gate electrode layer 12" (usually maintained at −5 volts to 0 volts) and the metal flange 40 (maintained at source electrode potential, usually 0 volts). The metal flange acts as a field plate by shielding the source from the drain potential. In the ON state of the transistor form of the device, when a switching potential is applied to the gate electrode, the interface region between the thin semiconductor layer 32' and the gate dielectric layer 14" is accumulated and a conductive channel 46 is formed, through which charge carriers may move. In the ON state of the sensor form of the device, when the device is illuminated, the charge transport layer 24" becomes conductive by generating electron/hole pairs. The photogenerated electrons move to the drain electrode 26", and the photogenerated holes move through the tunnel 42 to the n+ source electrodes 18" and are trapped therein. As holes move through the tunnel they create a low resistance path therein for electrons to move out of the source electrode and through the internal circuit. Charge from the holes also screens this region from the gate potential.

Figure 9:
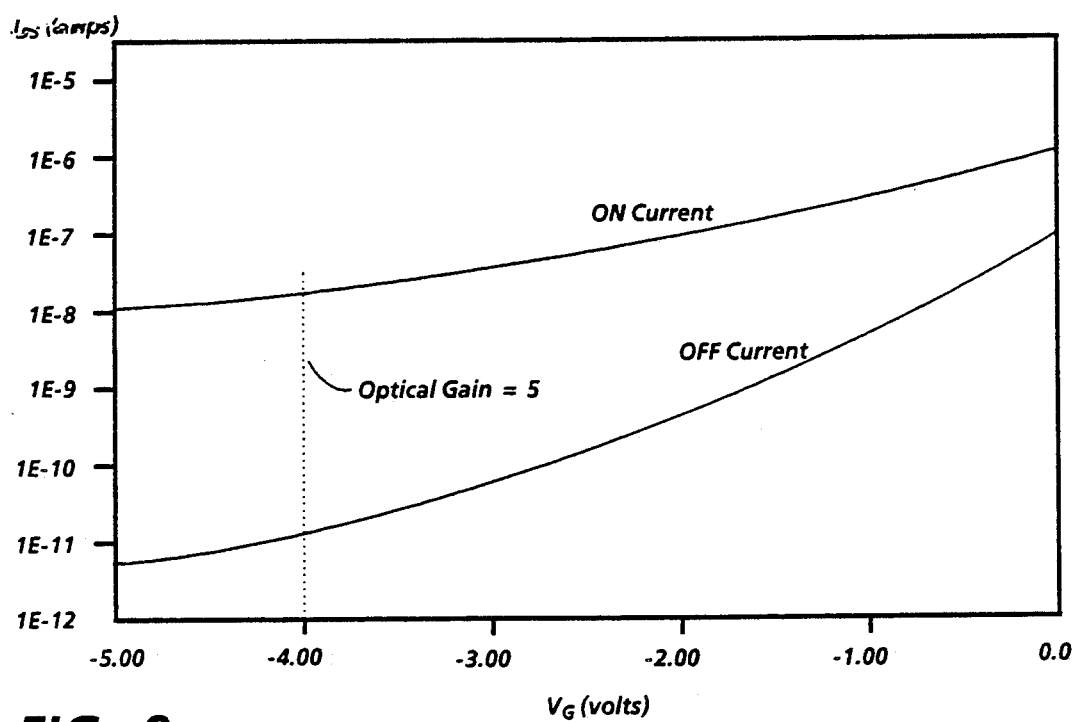
FIG. 9 illustrates light and dark output characteristics for the device of FIG. 7.

In FIG. 9 the ON/OFF ratios of a FIG. 8 sensor device is illustrated. Characteristic curves of the ON state and OFF state currents are plotted for different gate voltages. We used a monochromatic red LED light source having an intensity of about $10^{14}$ photons/cm$^2$/sec, which is comparable to about 1/1000 AM 1 (average ambient room light). At a gate voltage of about $-4$ volts the ON/OFF ratio is somewhat greater than three orders of magnitude and the measured optical gain was about 5.

Figure 10:
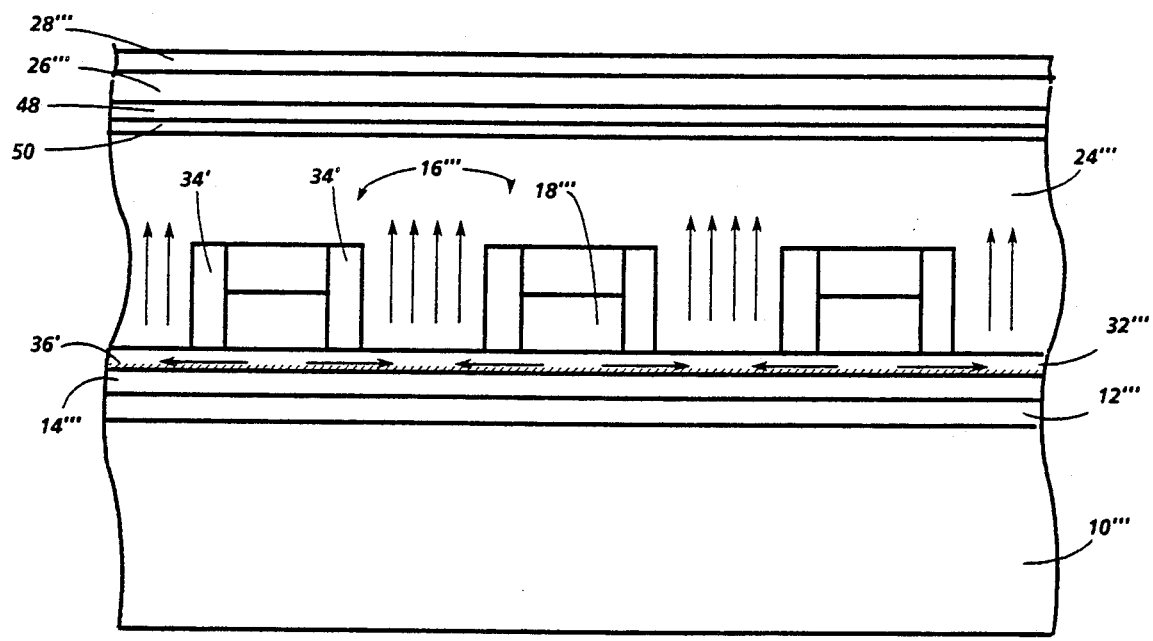
FIG. 10 is an enlarged side sectional view, similar to FIG. 7, showing an additional blocking layer.

An additional blocking layer may be provided, as illustrated in FIG. 10, in order to further suppress the sensor dark current. Although this embodiment is shown as a modification of the FIG. 7 device, it has applicability in any of the devices described. A lightly doped p-type blocking layer 50 (about 200 Å thick) overlies the semiconductor charge transport layer 24''' and is shown separated from the n+ drain electrode layer 26''' by a thin layer of intrinsic or lightly doped semiconductor (about 500 Å thick). This blocking layer may, however, be located anywhere within the semiconductor charge transport layer 24'''. While this device construction will improve the optical sensor performance it will slightly impair the transistor performance.

It should be understood that the present disclosure has been made only by way of example and numerous other changes in details of construction and the combination and arrangement of elements may be resorted to without departing from the true spirit and scope of the invention as hereinafter claimed.

What is claimed is:

1. A thin film transistor and sensor device comprising a substrate upon which is supported gate electrode means, gate dielectric means, source electrode means comprising source electrode fingers overlying said gate dielectric means, non-single crystal semiconductor means overlying said gate dielectric means and surrounding said source electrode means, drain electrode means contiguous with said semiconductor means, barrier means positioned adjacent said source electrode means and separated from and cooperating with said gate electrode means for preventing a drain field from reaching said source electrode means, the improvement comprising an electrically conductive electrode through which optical energy may pass to said semiconductor means between said fingers, and wherein said source electrode means includes means for establishing an electric field between adjacent source electrode fingers, and whereby said device selectively may be operated as a transistor or as a sensor.

2. The thin film transistor and sensor device as defined in claim 1 wherein said means for establishing an electric field comprises a first array of source electrode fingers and means for maintaining said first array at a first potential, and a second array of source electrode fingers and means for maintaining said second array at a second potential.

3. The thin film transistor and sensor device as defined in claim 2 wherein said first and second arrays of source electrode fingers are interdigitated.

4. A thin film transistor and sensor device comprising a substrate upon which is supported gate electrode means, gate dielectric means, source electrode means comprising source electrode fingers overlying said gate dielectric means, semiconductor means overlying said gate dielectric means and surrounding said source electrode means, drain electrode means contiguous with said semiconductor means, barrier means separated from and cooperating with said gate electrode means for preventing a drain field from reaching said source electrode means, the improvement comprising an electrically conductive electrode through which optical energy may pass to said semiconductor means between said fingers, so that said device selectively may be operated as a transistor or as a sensor, and wherein said barrier means is located adjacent the side walls of said source electrode means.

5. The thin film transistor and sensor device as defined in claim 1 or 4 wherein said barrier means is spaced from said gate dielectric means by a portion of said semiconductor means through which a channel region is defined.

6. The thin film transistor and sensor device as defined in claim 5 wherein said barrier means establishes a proximity barrier to current flow through said channel region in the absence of a gate field, and wherein said proximity barrier is abated in the presence of a gate field.

7. The thin film transistor and sensor device as defined in claim 6 wherein said barrier means depletes majority carriers from said channel region.

8. The thin film transistor and sensor device as defined in claim 6 wherein said barrier means comprises a semiconductor material heavily doped so as to spill, charge carriers of a sign opposite to the sign of the current carrying charge carriers of the transistor, into said channel region.

9. The thin film transistor and sensor device as defined in claim 8 wherein said semiconductor means comprises intrinsic amorphous silicon and said barrier means comprises heavily p-doped amorphous silicon.

10. The thin film transistor and sensor device as defined in claim 1 or 4 wherein said barrier means comprises a field plate maintained at the same potential as that applied to said source electrode means and which, together with said gate electrode means, prevents said drain field from reaching said source electrode means.

11. A thin film transistor and sensor device comprising a substrate upon which is supported gate electrode means, gate dielectric means, source electrode means comprising source electrode fingers overlying said gate dielectric means, semiconductor means overlying said gate dielectric means and surrounding said source electrode means, drain electrode means contiguous with said semiconductor means, barrier means positioned adjacent said source electrode means and separated from and cooperating with said gate electrode means for preventing a drain field from reaching said source electrode means, the improvement comprising an electrically conductive electrode through which optical energy may pass to said semiconductor means between said fingers so that said device selectively may be operated as a transistor or as a sensor, and a blocking layer for suppressing sensor dark current located within said semiconductor layer adjacent to and parallel with said drain electrode layer.

12. The thin film transistor and sensor device as defined in claim 11 wherein said blocking layer is lightly p-doped.

13. The thin film transistor and sensor device as defined in claim 5 further comprising a blocking layer located within said semiconductor layer adjacent to and parallel with said drain electrode layer.

14. The thin film transistor and sensor device as defined in claim 10 further comprising a blocking layer located within said semiconductor layer adjacent to and parallel with said drain electrode layer.

* * * * *